US011089709B2

(12) United States Patent
Takada et al.

(10) Patent No.: US 11,089,709 B2
(45) Date of Patent: *Aug. 10, 2021

(54) VEHICULAR CONTROL DEVICE

(71) Applicant: Mitsubishi Electric Corporation, Tokyo (JP)

(72) Inventors: Akiyo Takada, Tokyo (JP); Taketo Nishikawa, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 202 days.

This patent is subject to a terminal disclaimer.

(21) Appl. No.: 16/476,604

(22) PCT Filed: Jan. 30, 2017

(86) PCT No.: PCT/JP2017/003233
§ 371 (c)(1),
(2) Date: Jul. 9, 2019

(87) PCT Pub. No.: WO2018/138924
PCT Pub. Date: Aug. 2, 2018

(65) Prior Publication Data
US 2021/0144873 A1 May 13, 2021

(51) Int. Cl.
H05K 5/06 (2006.01)
H05K 5/03 (2006.01)
B60R 16/023 (2006.01)

(52) U.S. Cl.
CPC ........... *H05K 5/069* (2013.01); *B60R 16/023* (2013.01); *H05K 5/03* (2013.01)

(58) Field of Classification Search
CPC ......... H05K 5/069; H05K 5/03; B60R 16/023

USPC ........................................................ 361/730
See application file for complete search history.

(56) References Cited

U.S. PATENT DOCUMENTS

2006/0261599 A1* 11/2006 Ikemoto .................. E05C 19/06
292/121
2012/0003867 A1* 1/2012 Nihei .................. H01R 13/5213
439/533

FOREIGN PATENT DOCUMENTS

JP 2003031966 A 1/2003

OTHER PUBLICATIONS

International Search Report (PCT/ISA/210) dated Feb. 28, 2017, by the Japan Patent Office as the International Searching Authority for International Application No. PCT/JP2017/003233.

(Continued)

*Primary Examiner* — Sherman Ng
(74) *Attorney, Agent, or Firm* — Buchanan Ingersoll & Rooney PC

(57) ABSTRACT

A first projection and a second projection are disposed around an opening in a housing. A first fitting hole into which the first projection is to be fitted and a second fitting hole into which the second projection is to be fitted are formed around a central hole in a packing. The first projection and the second projection are respectively fitted into the first fitting hole and the second fitting hole, whereby the packing is attached to the housing. A cover to cover the opening and on an area around the opening is attached to the housing by means of a fastening member mated with the second projection with the packing placed between the cover and the housing.

19 Claims, 13 Drawing Sheets

(56) References Cited

OTHER PUBLICATIONS

Written Opinion (PCT/ISA/237) dated Feb. 28, 2017, by the Japan Patent Office as the International Searching Authority for International Application No. PCT/JP2017/003233.

* cited by examiner

VEHICULAR CONTROL DEVICE

TECHNICAL FIELD

The present disclosure relates to a vehicular control device in which a packing and a cover are disposed around an opening.

BACKGROUND ART

A housing in a vehicular control device installed in a railroad car includes an opening to enable periodic maintenance of electronic components inside the control device. In order to prevent water, dust, and the like from entering the housing, a cover is attached on the opening. In addition, in order to enhance the waterproof and dustproof performance, a packing is disposed between the opening and the cover.

Patent Literature 1 discloses a waterproof packing that is placed between a housing body and a door and is fastened between the housing body and the door with a bolt and a nut.

CITATION LIST

Patent Literature

Patent Literature 1: Unexamined Japanese Patent Application Kokai Publication No. 2003-31966

SUMMARY OF INVENTION

Technical Problem

Electronic components inside a vehicular control device installed in a railroad car are subject to periodic maintenance. In addition, a packing disposed between an opening and a cover in the vehicular control device is required to be periodically replaced in order to maintain dustproof and waterproof performance. A waterproof packing disclosed in Patent Literature 1 is disposed between a door and a housing body. The waterproof packing is fastened with bolts and nuts at regular spacing intervals, and thus all the bolts and nuts need to be removed before the waterproof packing is removed. Therefore, in cases where the waterproof packing disclosed in Patent Literature 1 is disposed on an opening in a vehicular control device, the maintenance work on the vehicular control device becomes more troublesome as the size of the opening is increased. For the purpose of making it easier to replace packings, the packing may sometimes be fastened only at, for example, the four corners of the packing with bolts and nuts. In this case, bolts are more distantly spaced as the size of the opening is increased, which causes the packing to sag under its own weight. As a result, the sealing performance of the packing may be reduced.

The present disclosure has been made in view of the foregoing circumstances, and an objective of the present disclosure is to improve maintainability of a vehicular control device while keeping the sealing performance of a packing.

Solution to Problem

To achieve the aforementioned objective, a vehicular control device of the present disclosure includes a housing installed in a vehicle, a first projection, a second projection, a packing, a cover, and a fastening member. An opening is formed in the housing. The first projection is provided around the opening and projects outward from the housing. The second projection is provided around the opening and projects outward from the housing. A central hole, which is a through hole, is formed in the packing. A first fitting hole into which the first projection is to be fitted is formed around the central hole, and a second fitting hole, which is a through hole into which the second projection is to be fitted, is formed around the central hole. The first projection is fitted into the first fitting hole and the second projection is fitted into the second fitting hole, whereby the packing is attached to the housing to cover the area around the opening. A first fastening hole, which is a through hole, is formed in the cover. The cover covers the opening and the area around the opening with the packing placed between the cover and the housing. A fastening member is inserted into the first fastening hole and mated with the second projection, whereby the cover is attached to the housing.

Advantageous Effects of Invention

According to the present disclosure, the packing is attached to the housing by respectively fitting the first projection and the second projection into the housing with the first fitting hole and the second fitting hole, where the first projection and the second projection are provided around the opening and the first fitting hole and the second fitting hole are formed in the packing, and the cover is attached to the housing by means of the fastening member mated with the second projection. As a result, the maintainability of the vehicular control device can be improved while the sealing performance of the vehicular control device is kept.

DESCRIPTION OF EMBODIMENTS

Figure 1:
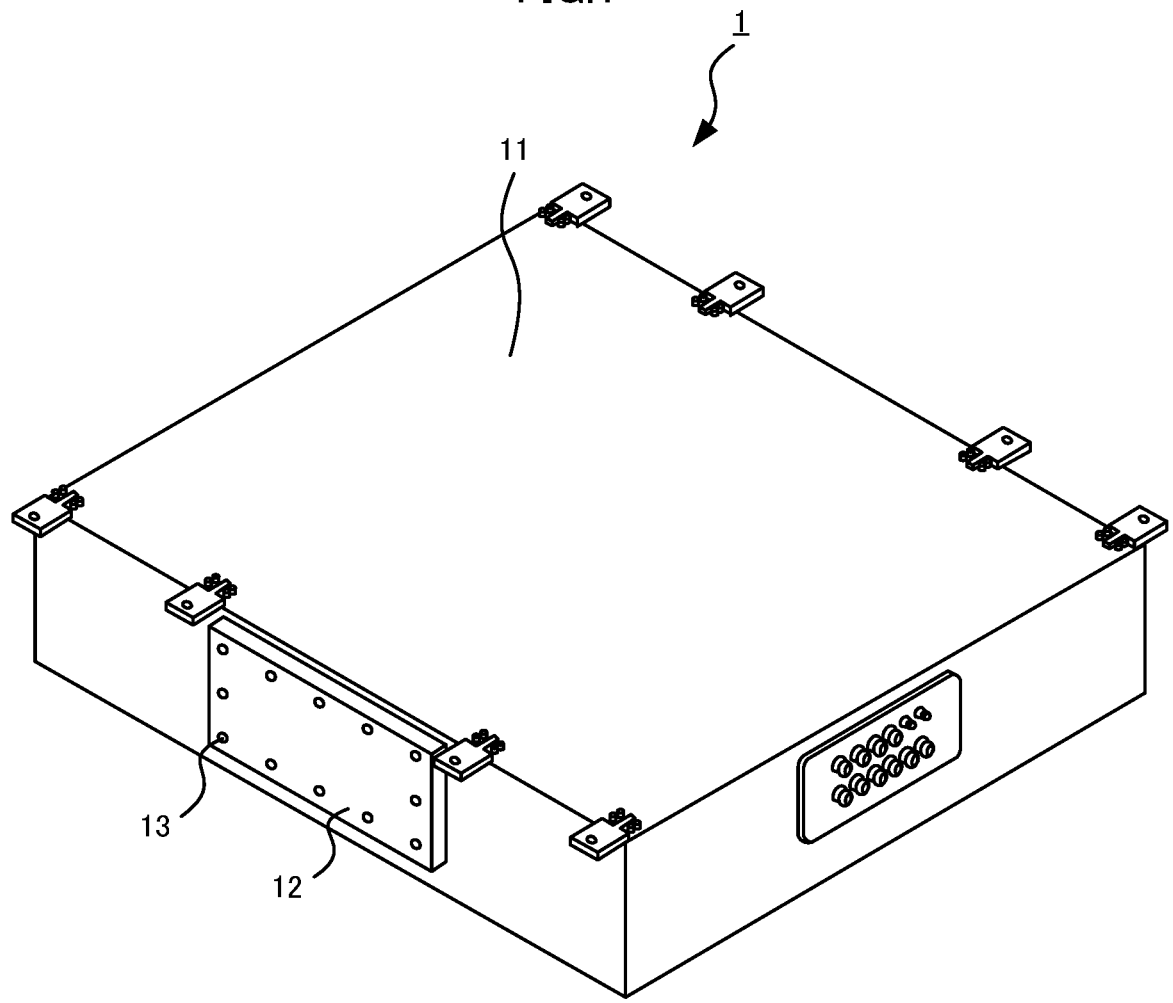
FIG. 1 is a perspective view of a vehicular control device according to an embodiment of the present disclosure.
Figure 1:
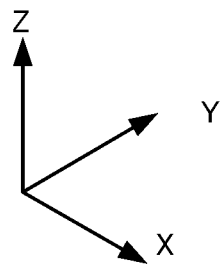

Embodiments of the present disclosure are described below in detail with reference to drawings. In the drawings, components that are the same or equivalent are assigned the same reference signs.

Figure 2:
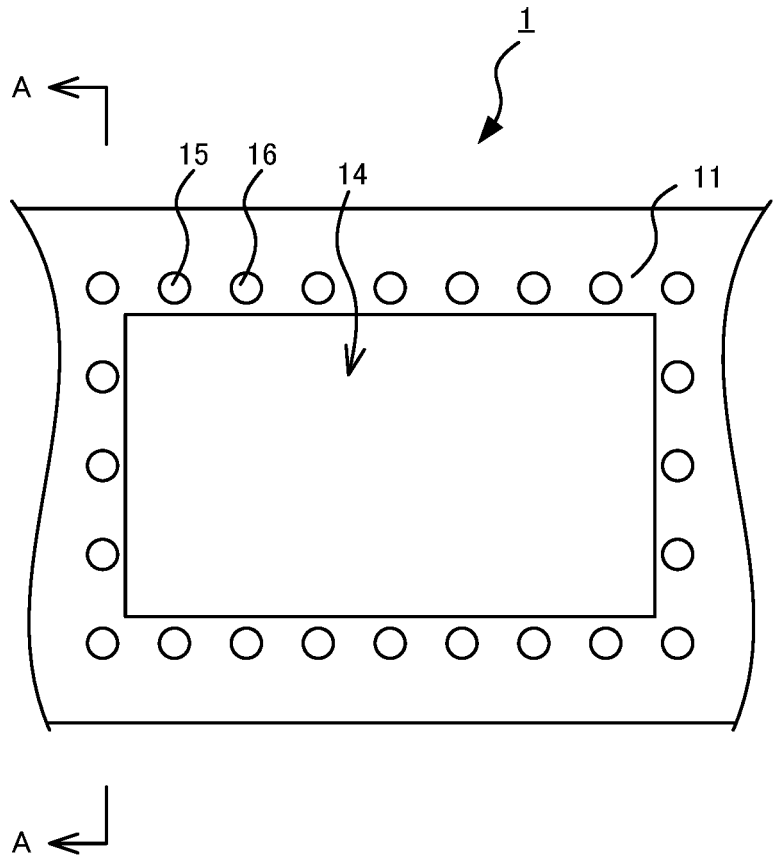
FIG. 2 is a front view of the vehicular control device according to the embodiment.
Figure 2:
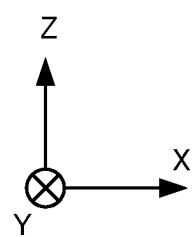

FIG. 1 is a perspective view of a vehicular control device according to an embodiment of the present disclosure. In FIG. 1, Z-axis represents a vertical direction, X-axis represents a direction in which a vehicle travels with the vehicular control device 1 installed therein, and Y-axis represents a width direction of the vehicle in which the vehicular control device 1 is installed. The vehicular control device 1 is installed in an electric railroad car, for example. A housing 11 of the vehicular control device 1 is installed under a floor of the vehicle or on top of a roof of the vehicle. The orientation of the vehicular control device 1 installed in a vehicle is not limited to an example illustrated in FIG. 1. FIG. 2 is a front view of the vehicular control device according to the embodiment. FIG. 2 shows the vehicular control device 1 seen in the Y-axis positive direction. An opening 14 is formed in the housing 11 in the vehicular control device 1. A cover 12 is disposed over the opening 14 and is fastened to the housing 11 with a fastening member 13.

A first projection 15 and a second projection 16 are provided around the opening 14 in the housing 11. In an example in FIG. 2, a plurality of first projections 15 and a plurality of second projections 16 are provided around the opening 14 in the housing 11. The plurality of the first projections 15 is provided at predetermined first intervals around the opening 14. The plurality of the second projections 16 is provided at predetermined second intervals around the opening 14. The first intervals and the second intervals are determined on the basis of the size of the opening 14, weight and material of a packing 17 described below, sealing performance desired for the vehicular control device 1, and so on. The first intervals may have the same value as or values different from values of the second intervals. In the example in FIG. 2, the first projections 15 and the second projections 16 are provided around the opening 14 such that the first projections 15 alternate with the second projections 16. Placing the first projections 15 and the second projections 16 alternately creates uniformity to improve the aesthetics of appearance. Cross sections of the first projections 15 orthogonal to the direction in which the first projections 15 project may have the same size as or sizes different from sizes of cross sections of the second projections 16 orthogonal to the direction in which the second projections 16 project. In the example in FIG. 2, the cross sections orthogonal to the direction in which the first projections 15 project have the same size as the sizes of the cross sections orthogonal to the direction in which the second projections 16 project.

Figure 3:
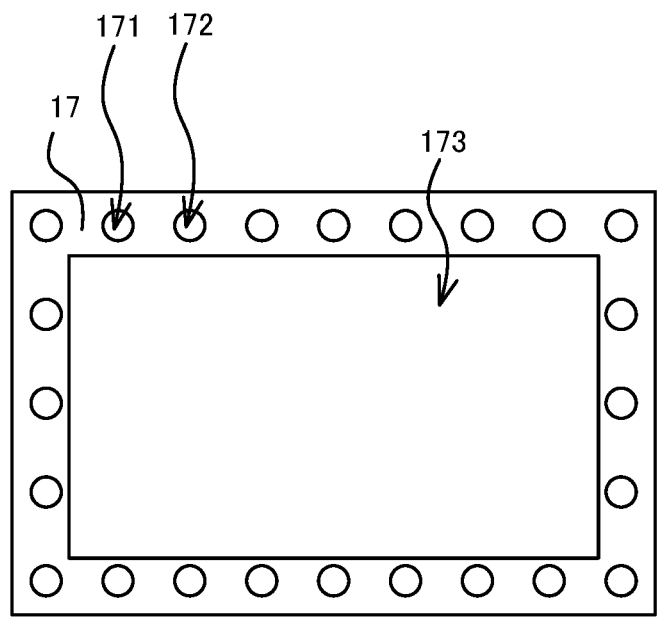
FIG. 3 is a front view of a packing according to the embodiment.
Figure 4:
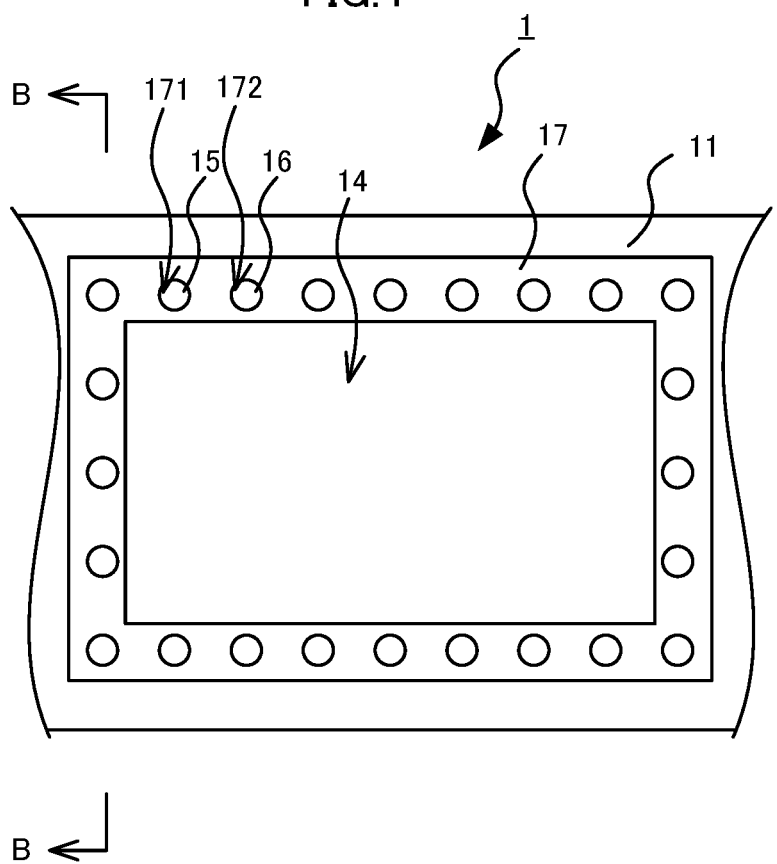
FIG. 4 is a front view of the vehicular control device according to the embodiment.
Figure 4:
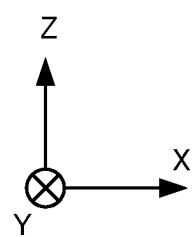

FIG. 3 is a front view of a packing according to the embodiment. In order to enhance waterproof and dustproof performance of the housing 11, a packing 17 is disposed around the opening 14 and between the housing 11 and the cover 12. A central hole 173, which is a through hole, is formed in the packing 17. Around the central hole 173 of the packing 17, a first fitting hole 171 into which the first projection 15 is to be fitted and a second fitting hole 172 that is a through hole into which the second projection 16 is to be fitted are formed. FIG. 4 is a front view of the vehicular control device according to the embodiment. FIG. 4 illustrates the state in which the packing 17 is attached to the housing 11. In examples in FIGS. 3 and 4, a plurality of first fitting holes 171 and a plurality of second fitting holes 172 are formed around the central hole 173. The first projection 15 is fitted into the first fitting hole 171 and the second projection 16 is fitted into the second fitting hole 172, whereby the packing 17 is attached to the housing 11 as illustrated in FIG. 4. When attached to the housing 11, the packing 17 covers an area around the opening 14 in the housing 11. In the examples in FIGS. 3 and 4, the first fitting hole 171 and the second fitting hole 172 are through holes. However, the first fitting hole 171 may not necessarily be a through hole.

Figure 5:
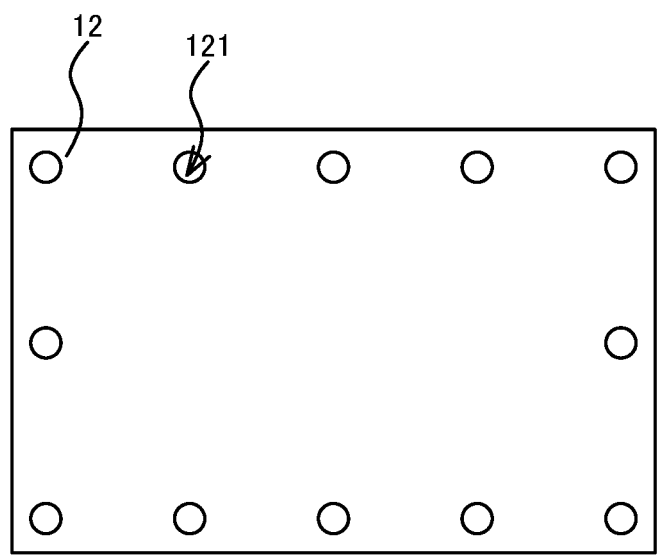
FIG. 5 is a front view of a cover according to the embodiment.
Figure 6:
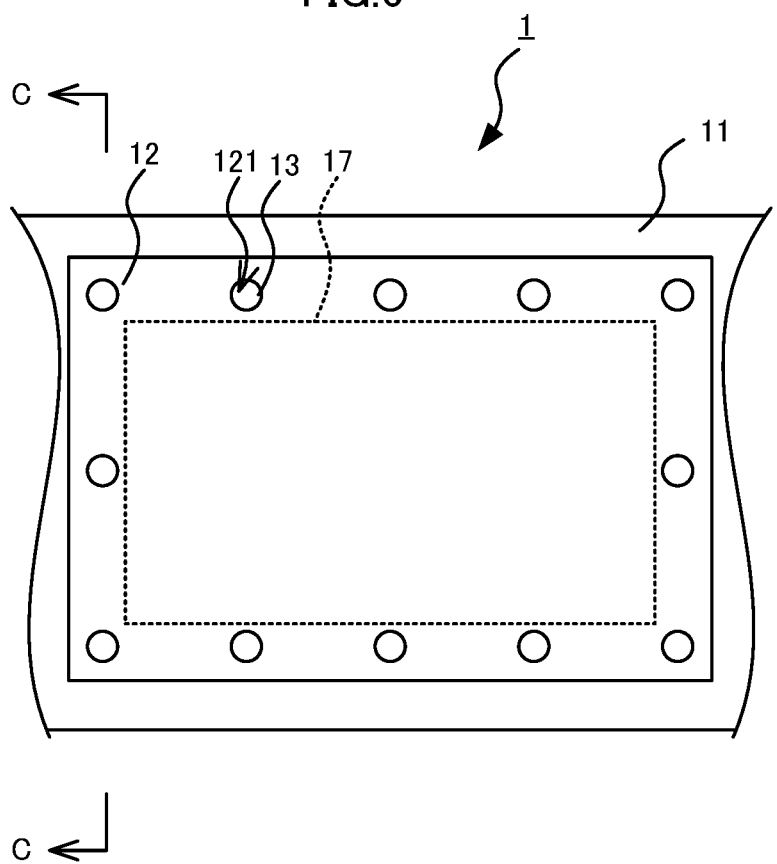
FIG. 6 is a front view of the vehicular control device according to the embodiment.
Figure 6:
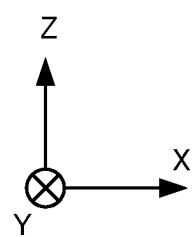

FIG. 5 is a front view of the cover according to the embodiment. FIG. 6 is a front view of the vehicular control device according to the embodiment. FIG. 6 illustrates the state in which the packing 17 and the cover 12 are attached to the housing 11. A first fastening hole 121, which is a through hole, is formed in the cover 12. In the examples in FIGS. 5 and 6, a plurality of first fastening holes 121 is formed in the cover 12. The fastening member 13 is inserted into the first fastening hole 121 and mated with the second projection 16, whereby the cover 12 is attached to the housing 11. The cover 12 covers the opening 14 and the area around the opening 14 with the packing 17 placed between the cover 12 and the housing 11.

As described above, the first projection 15 is fitted into the first fitting hole 171 and the second projection 16 is fitted into the second fitting hole 172, whereby the packing 17 is attached to the housing 11. The fastening member 13 is mated with the second projection 16, whereby the cover 12 is attached to the housing 11. This configuration makes it possible to perform maintenance of electronic components inside the vehicular control device 1 with the packing 17 attached to the housing 11. There is no need to remove the packing 17 every time maintenance of electronic components inside the vehicular control device 1 is performed. Thus, degradation of the packing 17 caused by repetitive removal and reinstallation of the packing 17 can be suppressed. Therefore, the vehicular control device 1 can keep its sealing performance.

Owing to the second projection 16 to be mated with the fastening member 13 and the first projection 15, the packing 17 is attached to the housing 11. The packing 17 is prevented from sagging under its own weight by adjusting the number of first projections 15 on the basis of the size of the opening 14, the weight and material of the packing 17, the sealing performance desired for the vehicular control device 1, and so on. As a result, the packing 17 keeps its sealing performance and the vehicular control device 1 keeps its sealing performance. Attachment and removal of the fastening member 13 are unaffected by any increase in the number of first projections 15 intended to keep the sealing performance of the packing 17. In other words, although the number of first projections 15 is increased in order to keep the sealing performance of the vehicular control device 1, work on maintenance of the vehicular control device 1 does not become troublesome. In the vehicular control device 1 according to the embodiment, the fastening member 13 is mated only with the second projection 16. Hence, the work on maintenance of the vehicular control device 1 is easier than the work involving fastening a waterproof packing with bolts and nuts that are spaced by a certain pitch.

Since the first projection 15 and the second projection 16 are provided on the housing 11, processes of the cover 12 like welding or cutting are unnecessary. Thus, a thin plate made of aluminum, stainless steel, or the like can be used as the cover 12. Using a thin plate made of aluminum, stainless steel, or the like reduces the weight of the cover 12, which in turn improves maintainability of the vehicular control device 1.

Figure 7:
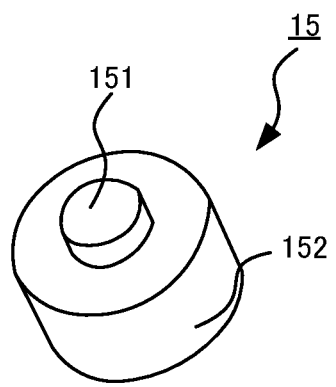
FIG. 7 is a perspective view of a first projection according to the embodiment.
Figure 8:
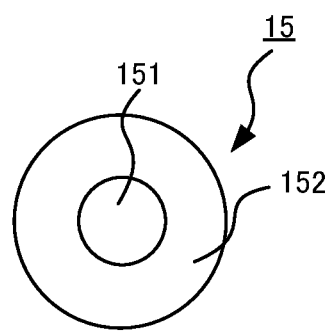
FIG. 8 is a top view of the first projection according to the embodiment.
Figure 9:
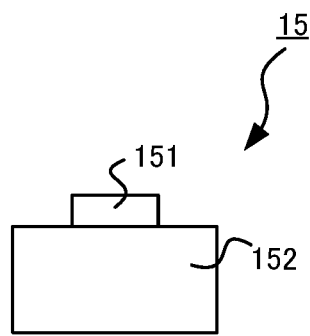
FIG. 9 is a front view of the first projection according to the embodiment.
Figure 10:
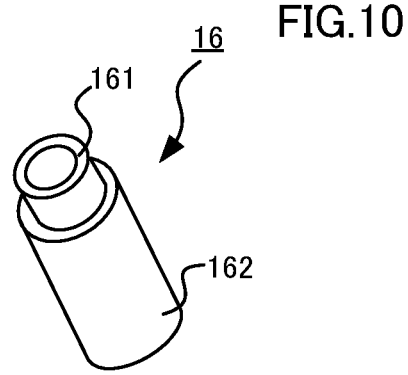
FIG. 10 is a perspective view of a second projection according to the embodiment.
Figure 11:
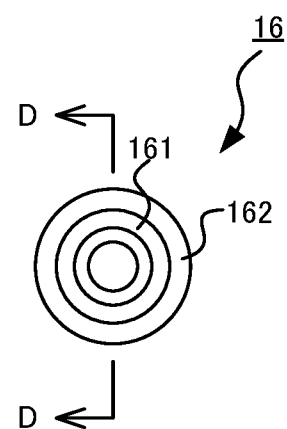
FIG. 11 is a top view of the second projection according to the embodiment.
Figure 12:
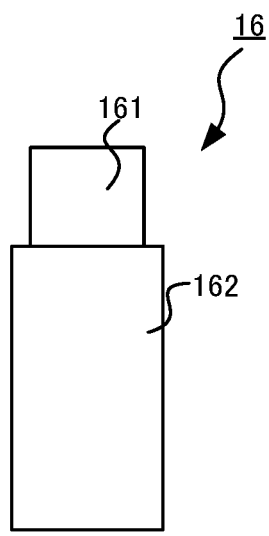
FIG. 12 is a front view of the second projection according to the embodiment.
Figure 13:
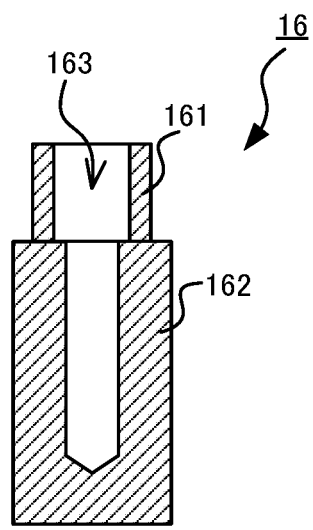
FIG. 13 is a cross-sectional view of the second projection according to the embodiment.

Any method may be used for forming the first projection 15 and the second projection 16. FIG. 7 is a perspective view of the first projection according to the embodiment. FIG. 8 is a top view of the first projection according to the embodiment. FIG. 9 is a front view of the first projection according to the embodiment. FIG. 10 is a perspective view of the second projection according to the embodiment. FIG. 11 is a top view of the second projection according to the embodiment. FIG. 12 is a front view of the second projection according to the embodiment. FIG. 13 is a cross-sectional view of the second projection according to the embodiment. FIG. 13 is a cross-sectional view taken along the line D-D in FIG. 11.

In the embodiment, the first projection 15 includes a first tip 151 having a cylindrical shape and a first base 152 having a cylindrical shape that has a cross section larger than a cross section of the first tip 151. One end of the first tip 151 in the central axis direction is fixed to one end of the first base 152 with respect to the central axis direction. The first tip 151 and the first base 152 may be integrally molded or may be separately molded and then welded together.

In the embodiment, the second projection 16 includes a second tip 161 having a cylindrical shape and a second base 162 having a cylindrical shape that has a cross section larger than a cross section of the second tip 161. One end of the second tip 161 with respect to the central axis direction is fixed to one end of the second base 162 with respect to the central axis direction. The second tip 161 and the second base 162 may be integrally molded or may be separately molded and then welded together. A second fastening hole 163 into which the fastening member 13 is to be fitted is formed in the second projection 16. The second fastening hole 163 passes through the second tip 161 to reach the second base 162.

Figure 14:
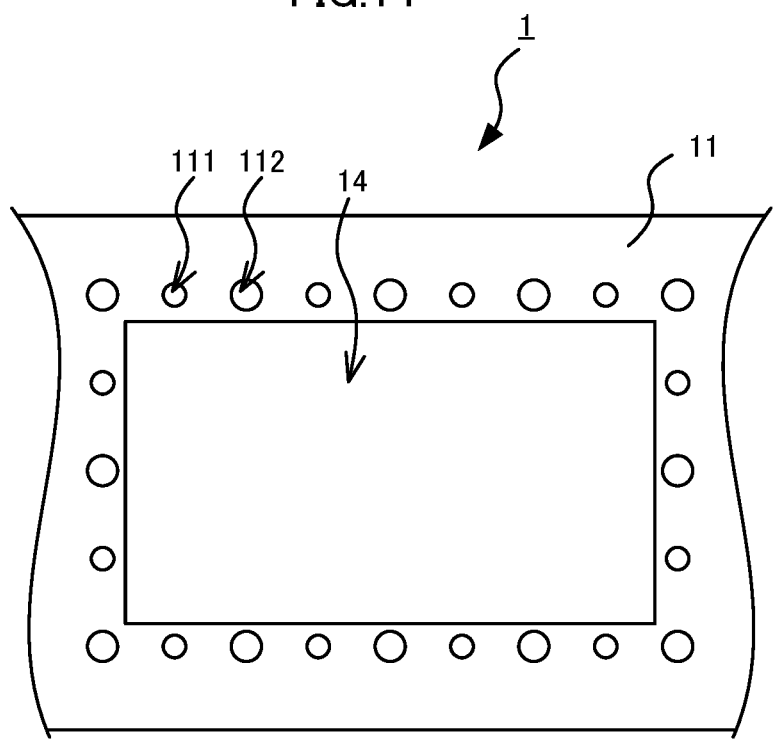
FIG. 14 is a front view of a housing according to the embodiment.
Figure 14:
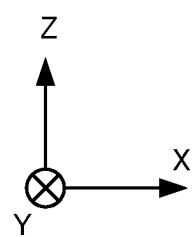

FIG. 14 is a front view of the housing according to the embodiment. Around the opening 14 in the housing 11, a first insertion hole 111, which is a through hole into which part of the first projection 15 is to be inserted, is formed. Around the opening 14 in the housing 11, a second insertion hole 112, which is a through hole into which part of the second projection 16 is to be inserted, is formed. In the example in FIG. 14, a plurality of first insertion holes 111 and a plurality of second insertion holes 112 are formed around the opening 14 in the housing 11. In the example in FIG. 14, the first insertion hole 111 is smaller than the second insertion hole 112. The first projection 15 is not used for fixing the cover 12 and is to be fitted into the first insertion hole 111. Making the first insertion hole 111 smaller in size than the second insertion hole 112 enables improvement in the sealing performance of the vehicular control device 1. In addition, the effect of preventing the packing 17 from being detached is provided.

Figure 15:
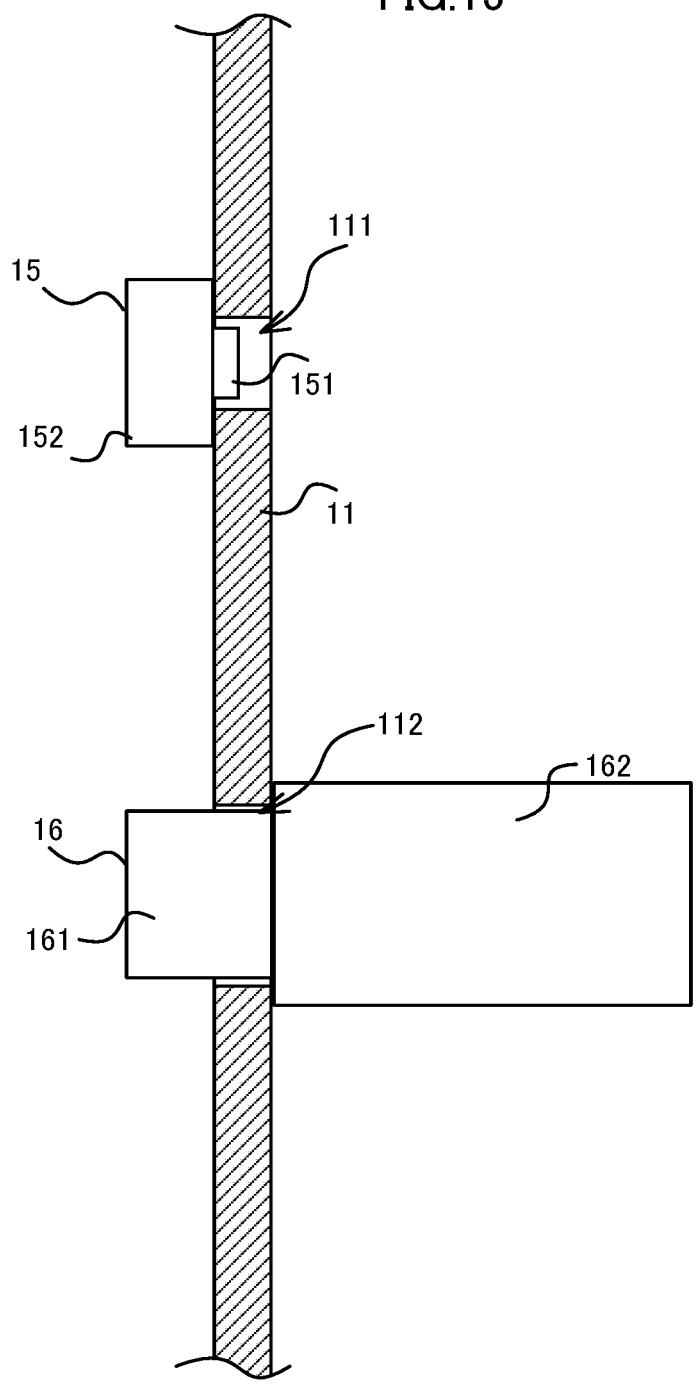
FIG. 15 is a partial cross-sectional view of the vehicular control device according to the embodiment.

FIG. 15 is a partial cross-sectional view of the vehicular control device according to the embodiment. FIG. 15 shows a cross-sectional view taken along the line A-A in FIG. 2. The first tip 151 of the first projection 15 is inserted into the first insertion hole 111. The first base 152 of the first projection 15 projects outward from the housing 11. A cross section of the first base 152 orthogonal to a pass-through direction of the first insertion hole 111, that is, the Y-axis direction, is larger than a cross section of the first insertion hole 111 orthogonal to the Y-axis direction. In the state in which the first tip 151 is inserted into the first insertion hole 111, width of the first tip 151 along the Y-axis direction is, for example, equal to or less than the width of the housing 11 along the Y-axis direction. In this case, the first projection 15 can be bonded to the housing 11 through plug welding from the inside of the housing 11. Bonding through plug welding allows the first projection 15 to be bonded to the housing 11 with a very small amount of welding. The width of the first tip 151 along the Y-axis direction may be not more than half the width of the housing 11 along the Y-axis direction. When the width of the first tip 151 along the Y-axis direction is not more than half the width of the housing 11 along the Y-axis direction, the amount of a weld bead coming out from the plug-welding point to the inside of the housing 11 can be reduced, and thus the aesthetics of appearance of the vehicular control device 1 is maintained. In other words, removal of an extra weld bead for preserving the aesthetics of appearance of the vehicular control device 1 becomes unnecessary.

One end of the second tip 161 of the second projection 16 is inserted into the second insertion hole 112, while the other end thereof projects outward from the housing 11. One end of the second base 162 is fixed to the second tip 161, while the other end thereof projects inward from the housing 11. A cross section of the second base 162 orthogonal to a pass-through direction of the second insertion hole 112, that is, the Y-axis direction, is larger than a cross section of the second insertion hole 112 orthogonal to the Y-axis direction. In the present embodiment, the second projection 16 can be bonded to the housing 11 through all-around welding of the second base 162 from the inside of the housing 11.

The first projection 15 is not mated with the fastening member 13. Thus, the first tip 151 can have a smaller cross section orthogonal to the Y-axis direction than a cross section of the second base 162 orthogonal to the Y-axis direction, where the second fastening hole 163 is formed in the second base 162 and the fastening member 13 is to be fitted into the second fastening hole 163. Therefore, the first insertion hole 111 can have a smaller cross section orthogonal to the Y-axis direction than a cross section of the second insertion hole 112 orthogonal to the Y-axis direction. As the first insertion hole 111 is formed to have a smaller cross section orthogonal to the Y-axis direction than a cross section of the second insertion hole 112 orthogonal to the Y-axis direction, the sealing performance of the vehicular control device 1 can be improved. A cross section of the first base 152 orthogonal to the Y-axis direction may have the same size as or a size different from that of a cross section of the second tip 161 orthogonal to the Y-axis direction. Disposing the first projection 15 and the second projection 16 as in the above-described manner eliminates the need for sheet-metal working, such as extrusion or cutting, on the housing 11.

Figure 16:
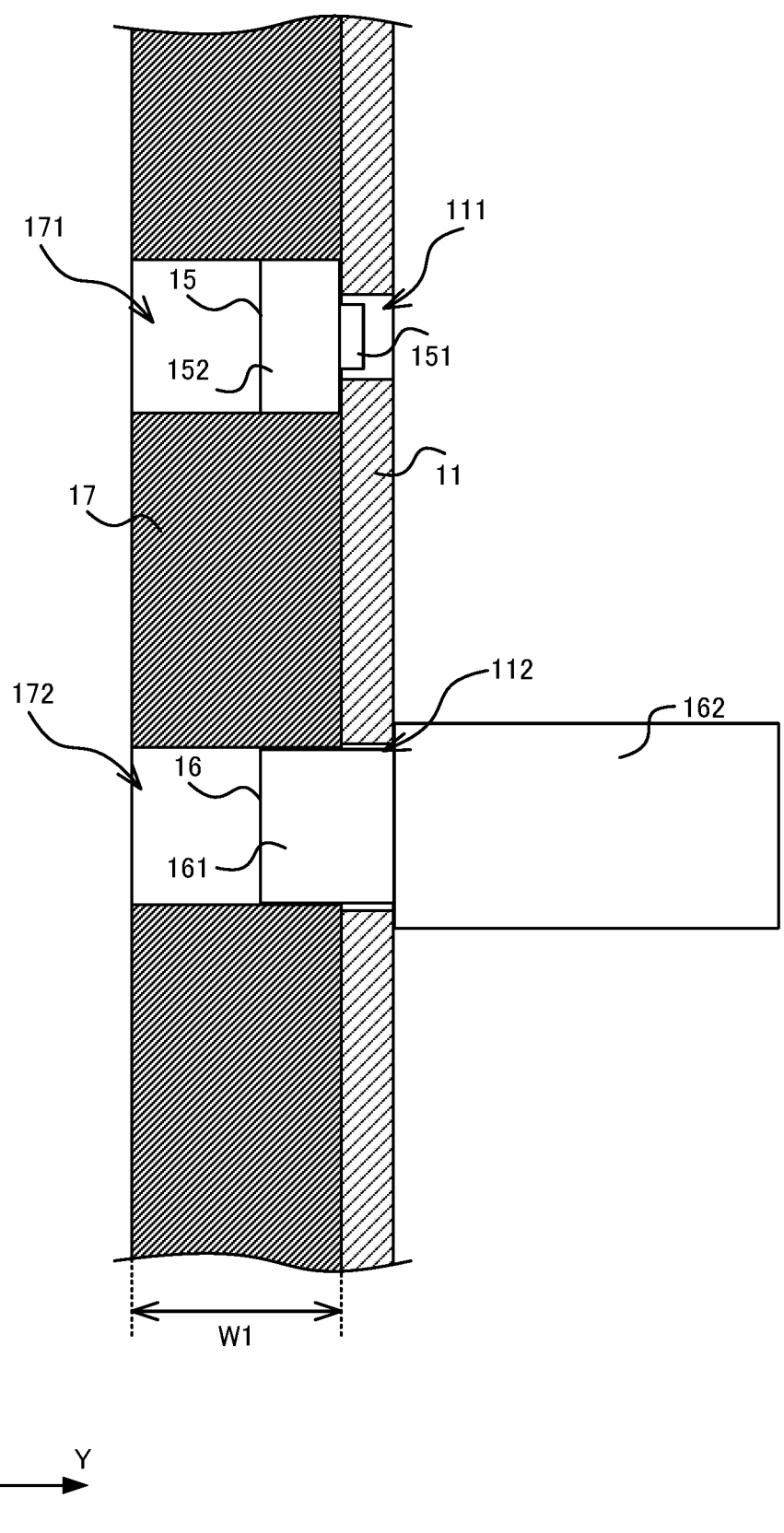
FIG. 16 is a partial cross-sectional view of the vehicular control device according to the embodiment.

FIG. 16 is a partial cross-sectional view of the vehicular control device according to the embodiment. FIG. 16 shows a cross-sectional view taken along the line B-B in FIG. 4. The packing 17 is formed of a member that is to compress in the pressing direction when pressed. In the state in which the packing 17 is attached to the housing 11 and the cover 12 is not attached to the housing 11, the width W1 of the packing 17 along a pass-through direction of the central hole 173, that is, the Y-axis direction, is greater than projecting length of the first projection 15 projecting outward from the housing 11 and is also greater than projecting length of the second projection 16 projecting outward from the housing 11. In the example in FIG. 16, the width W1 of the packing 17 along the Y-axis direction is greater than projecting length of the first base 152 projecting outward from the housing 11 and is also greater than projecting length of the second tip 161 projecting outward from the housing 11.

Figure 17:
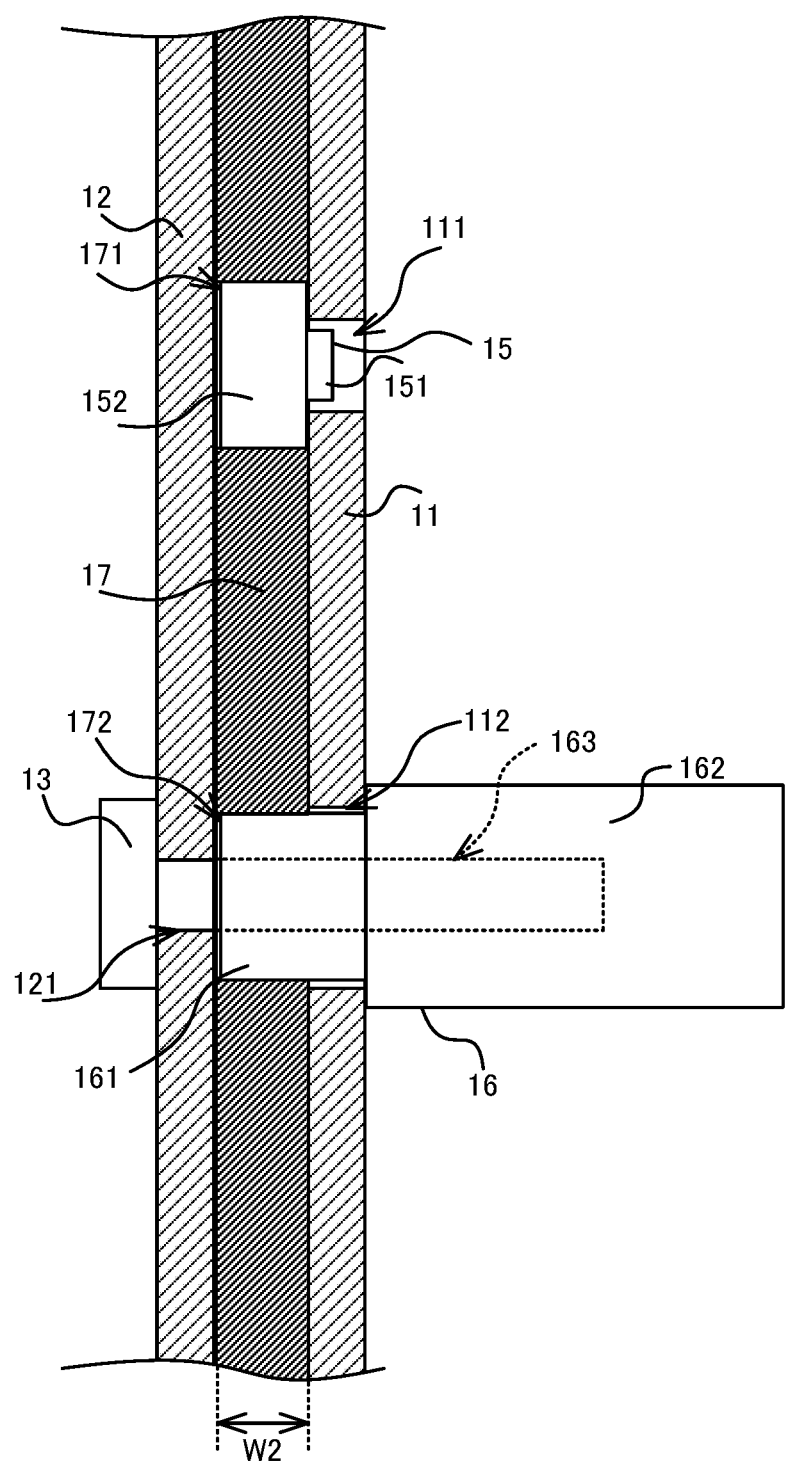
FIG. 17 is a partial cross-sectional view of the vehicular control device according to the embodiment.
Figure 17:
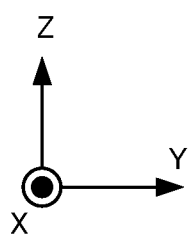

FIG. 17 is a partial cross-sectional view of the vehicular control device according to the embodiment. FIG. 17 shows a cross-sectional view taken along the line C-C in FIG. 6. In the state in which the cover 12 is attached to the housing 11, the width W2 of the packing 17 along the Y-axis direction is less than W1, equal to or greater than the projecting length of the first projection 15 projecting outward from the housing 11, and equal to or greater than the projecting length of the second projection 16 projecting outward from the housing 11. In the state in which the cover 12 is attached to the housing 11, a compression ratio at which the packing 17 is compressed in the Y-axis direction falls within a specified range. The specified range is determined on the basis of the sealing performance desired for the packing 17.

In the state in which the packing 17 is not attached to the housing 11, a cross section, orthogonal to the direction in which the first fitting hole 171 extends, of the first fitting hole 171 is smaller than a cross section, orthogonal to the direction in which the first projection 15 projects, of the first projection 15. In the state in which the packing 17 is not attached to the housing 11, a cross section, orthogonal to the direction in which the second fitting hole 172 extends, of the second fitting hole 172 is smaller than a cross section, orthogonal to the direction in which the second projection 16 projects, of the second projection 16. When the packing 17 is being attached to the housing 11, the packing 17 is pressed while the first fitting hole 171 and the second fitting hole 172 are enlarged. As the packing 17 is pressed and deformed, in the state in which the packing 17 is attached to the housing 11, the inner circumferential face of the first fitting hole 171 abuts on the outer circumferential face of the first projection 15, and the inner circumferential face of the second fitting hole 172 abuts on the outer circumferential face of the second projection 16. In the example in FIG. 17, the inner circumferential face of the first fitting hole 171 abuts on the outer circumferential face of the first base 152, and the inner circumferential face of the second fitting hole 172 abuts on the outer circumferential face of the second tip 161. In the state in which the packing 17 is not attached to the housing 11, cross sections of the first fitting hole 171 and the second fitting hole 172 are made to respectively become smaller than cross sections of the first projection 15 and the second projection 16. Therefore, the sealing performance of the packing 17 can be improved. As a result, the sealing performance of the vehicular control device 1 can be improved.

As described above, in the vehicular control device 1 according to the present embodiment, the packing 17 is attached to the housing 11 by respectively fitting the first projection 15 and the second projection 16 in the housing 11 into the first fitting hole 171 and the second fitting hole 172, where fitting the first projection 15 and the second projection 16 are provided around the opening 14 and the first fitting hole 171 and the second fitting hole 172 are formed in the packing 17, and the cover 12 is attached to the housing 11 by means of the fastening member 13 that is mated with the second projection 16. As a result, the maintainability of the vehicular control device 1 can be improved while the sealing performance of the vehicular control device 1 is kept.

In a case in which the packing 17 is fixed with, for example, an adhesive, the packing 17 cannot be easily replaced, which makes it difficult to maintain the dustproof and waterproof performance of the housing 11. By contrast, in the vehicular control device 1 according to the present embodiment, the packing 17 can be attached to the housing 11 by respectively fitting the first projection 15 and the second projection 16 into the first fitting hole 171 and the second fitting hole 172, where the first projection 15 and the second projection 16 are provided around the opening 14 in the housing 11 and the first fitting hole 171 and the second fitting hole 172 are formed in the packing 17. Hence, the packing 17 can be retained without being fixed to the housing 11 with an adhesive, and thus the packing 17 can be easily removed and attached. Therefore, the maintainability of the packing 17 can be improved. As a result of improving the maintainability of the packing 17, the dustproof and waterproof performance of the housing 11 can be kept.

The present disclosure is not limited to the foregoing embodiments. The number of the first projections 15 and the number of the second projections 16 may be freely selected, as determined on the basis of the size of the opening 14, the weight and material of the packing 17, the sealing performance desired for the vehicular control device 1, and so on. Either one of the first projection 15 and the second projection 16 may be provided on an inner periphery closer to the opening 14, and the other may be provided on an outer periphery. Shapes of the first projection 15 and the second projection 16 are not limited to those described in the examples above, and may be, for example, tubular shapes surrounding the opening 14. The central hole 173 may also serve as the first fitting hole 171, and the first projection 15 having a shape of, for example, a tube surrounding the opening 14 may be mated with the central hole 173. In this case, the central hole 173 is mated with the first projection 15 and the second fitting hole 172 is mated with the second projection 16, whereby the packing 17 is attached to the housing 11. Each of the first fitting hole 171 and the second fitting hole 172 may be a slit.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Vehicular control device
11 Housing
12 Cover
13 Fastening member
14 Opening
15 First projection
16 Second projection
17 Packing
111 First insertion hole
112 Second insertion hole
121 First fastening hole
151 First tip
152 First base
161 Second tip
162 Second base
163 Second fastening hole
171 First fitting hole
172 Second fitting hole
173 Central hole

The invention claimed is:

1. A vehicular control device comprising:
a housing in which an opening is formed, the housing being installed in a vehicle;
a first projection provided around the opening and projecting outward from the housing;
a second projection provided around the opening and projecting outward from the housing;
a packing having
a central hole that is a through hole,
a first fitting hole into which the first projection is to be fitted, the first fitting hole being formed around the central hole, and
a second fitting hole that is a through hole into which the second projection is to be fitted, the second fitting hole being formed around the central hole,
wherein the first projection is fitted into the first fitting hole and the second projection is fitted into the second fitting hole, whereby the packing is attached to the housing and covers an area around the opening;
a cover having a first fastening hole that is a through hole and covering the opening and the area around the opening with the packing placed between the cover and the housing; and
a fastening member inserted into the first fastening hole and mated with the second projection, thereby attaching the cover to the housing.

2. The vehicular control device according to claim 1, wherein
the housing further has a first insertion hole into which a portion of the first projection is to be inserted, the first insertion hole being formed around the opening in the housing, the first insertion hole being a through hole, and
the first projection comprises:
a first tip to be inserted into the first insertion hole; and
a first base having
one end that is fixed to the first tip,
another end that projects outward from the housing, and
a cross section larger than a cross section of the first insertion hole, the cross section of the first insertion hole being orthogonal to a pass-through direction of the first insertion hole.

3. The vehicular control device according to claim 2, wherein
a width of the first tip along the pass-through direction of the first insertion hole is equal to or less than a width of the housing along the pass-through direction of the first insertion hole, and
the first projection comprises the first tip bonded to the housing through plug welding from an interior of the housing.

4. The vehicular control device according to claim 2, wherein a width of the first tip along the pass-through direction of the first insertion hole is equal to or less than half a width of the housing along the pass-through direction of the first insertion hole.

5. The vehicular control device according to claim 3, wherein a width of the first tip along the pass-through direction of the first insertion hole is equal to or less than half a width of the housing along the pass-through direction of the first insertion hole.

6. The vehicular control device according to claim 1, wherein
a second insertion hole into which a portion of the second projection is to be inserted is formed around the opening in the housing, the second insertion hole being a through hole, and
the second projection comprises:
a second tip having
one end that is to be inserted into the second insertion hole, and
another end that projects outward from the housing; and
a second base disposed inside the housing, the second base having (i) one end that is fixed to the second tip and (ii) a cross section larger than a cross section of the second insertion hole, the cross section of the second insertion hole being orthogonal to a pass-through direction of the second insertion hole.

7. The vehicular control device according to claim 2, wherein
a second insertion hole into which a portion of the second projection is to be inserted is formed around the opening in the housing, the second insertion hole being a through hole, and
the second projection comprises:
a second tip having
one end that is to be inserted into the second insertion hole, and
another end that projects outward from the housing; and
a second base disposed inside the housing, the second base having (i) one end that is fixed to the second tip and (ii) a cross section larger than a cross section of the second insertion hole, the cross section of the second insertion hole being orthogonal to a pass-through direction of the second insertion hole.

8. The vehicular control device according to claim 6, wherein
the second projection has a second fastening hole extending from one end of the second projection in a direction opposite to a projection direction of the second projection, the one end of the second projection projecting outward from the housing,
the second fastening hole passes through the second tip to reach the second base, and
the fastening member is inserted into the first fastening hole and fitted into the second fastening hole, thereby attaching the cover to the housing.

9. The vehicular control device according to claim 7, wherein
the second projection has a second fastening hole extending from one end of the second projection in a direction opposite to a projection direction of the second projection, the one end of the second projection projecting outward from the housing,
the second fastening hole passes through the second tip to reach the second base, and
the fastening member is inserted into the first fastening hole and fitted into the second fastening hole, thereby attaching the cover to the housing.

10. The vehicular control device according to claim 6, wherein the second projection comprises the second base bonded to the housing through all-around welding from an interior of the housing.

11. The vehicular control device according to claim 7, wherein the second projection comprises the second base bonded to the housing through all-around welding from an interior of the housing.

12. The vehicular control device according to claim 1, wherein
a first insertion hole into which a portion of the first projection is to be inserted, the first insertion hole being formed around the opening in the housing, the first insertion hole being a through hole,
a second insertion hole into which a portion of the second projection is to be inserted is formed around the opening in the housing, the second insertion hole being a through hole,
a cross section of the first insertion hole, the cross section of the first insertion hole being orthogonal to a pass-through direction of the first insertion hole, is smaller than a cross section of the second insertion hole, the cross section of the second insertion hole being orthogonal to a pass-through direction of the second insertion hole,
the first projection comprises:
a first tip to be inserted into the first insertion hole; and
a first base having
one end that is fixed to the first tip,
another end that projects outward from the housing, and
a cross section larger than a cross section of the first insertion hole, the cross section of the first insertion hole being orthogonal to a pass-through direction of the first insertion hole, and
the second projection comprises:
a second tip having
one end that is to be inserted into the second insertion hole,
another end that projects outward from the housing, and
a second base disposed inside the housing, the second base having (i) one end that is fixed to the second tip and (ii) a cross section larger than a cross section of the second insertion hole, the cross section of the second insertion hole being orthogonal to a pass-through direction of the second insertion hole.

13. The vehicular control device according to claim 2, wherein
a first insertion hole into which a portion of the first projection is to be inserted, the first insertion hole being formed around the opening in the housing, the first insertion hole being a through hole,
a second insertion hole into which a portion of the second projection is to be inserted is formed around the opening in the housing, the second insertion hole being a through hole,
a cross section of the first insertion hole, the cross section of the first insertion hole being orthogonal to a pass-through direction of the first insertion hole, is smaller than a cross section of the second insertion hole, the cross section of the second insertion hole being orthogonal to a pass-through direction of the second insertion hole,
the first projection comprises:
a first tip to be inserted into the first insertion hole; and
a first base having
one end that is fixed to the first tip,
another end that projects outward from the housing, and
a cross section larger than a cross section of the first insertion hole, the cross section of the first insertion hole being orthogonal to a pass-through direction of the first insertion hole, and
the second projection comprises:
a second tip having
one end that is to be inserted into the second insertion hole,
another end that projects outward from the housing, and
a second base disposed inside the housing, the second base having (i) one end that is fixed to the second tip and (ii) a cross section larger than a cross section of the second insertion hole, the cross section of the second insertion hole being orthogonal to a pass-through direction of the second insertion hole.

14. The vehicular control device according to claim 1, wherein the first projection is a plurality of first projections, the second projection is a plurality of second projections, and the plurality of first projections and the plurality of second projections are provided alternately.

15. The vehicular control device according to claim 2, wherein the first projection is a plurality of first projections, the second projection is a plurality of second projections, and the plurality of first projections and the plurality of second projections are provided alternately.

16. The vehicular control device according to claim 1, wherein
the packing is formed of a member that compresses in a pressing direction when pressed,
in a state in which the packing is attached to the housing and the cover is not attached to the housing, a width of the packing along a pass-through direction of the central hole is greater than a projecting length of the first projection projecting outward from the housing and is greater than a projecting length of the second projection projecting outward from the housing, and
in a state in which the cover is attached to the housing, a compression ratio at which the packing is compressed in a pass-through direction of the central hole falls within a specified range.

17. The vehicular control device according to claim 2, wherein
the packing is formed of a member that compresses in a pressing direction when pressed,
in a state in which the packing is attached to the housing and the cover is not attached to the housing, a width of the packing along a pass-through direction of the central hole is greater than a projecting length of the first projection projecting outward from the housing and is greater than a projecting length of the second projection projecting outward from the housing, and
in a state in which the cover is attached to the housing, a compression ratio at which the packing is compressed in a pass-through direction of the central hole falls within a specified range.

18. The vehicular control device according to claim 1, wherein the packing is formed of a member that compresses in a pressing direction when pressed,
in a state in which the packing is not attached to the housing, (i) a cross section of the first fitting hole, the cross section of the first fitting hole being orthogonal to a direction in which the first fitting hole extends, is smaller than a cross section of the first projection, the cross section of the first projection being orthogonal to a direction in which the first projection projects, and (ii) a cross section of the second fitting hole, the cross section of the second fitting hole being orthogonal to a direction in which the second fitting hole extends, is smaller than a cross section of the second projection, the cross section of the second projection being orthogonal to a direction in which the second projection projects, and in a state in which the packing is attached to the housing, an inner circumferential face of the first fitting hole abuts on an outer circumferential face of the first projection, and an inner circumferential face of the second fitting hole abuts on an outer circumferential face of the second projection.

19. The vehicular control device according to claim 2, wherein the packing is formed of a member that compresses in a pressing direction when pressed, in a state in which the packing is not attached to the housing, (i) a cross section of the first fitting hole, the cross section of the first fitting hole being orthogonal to a direction in which the first fitting hole extends, is smaller than a cross section of the first projection, the cross section of the first projection being orthogonal to a direction in which the first projection projects, and (ii) a cross section of the second fitting hole, the cross section of the second fitting hole being orthogonal to a direction in which the second fitting hole extends, is smaller than a cross section of the second projection, the cross section of the second projection being orthogonal to a direction in which the second projection projects, and in a state in which the packing is attached to the housing, an inner circumferential face of the first fitting hole abuts on an outer circumferential face of the first projection, and an inner circumferential face of the second fitting hole abuts on an outer circumferential face of the second projection.

* * * * *